(12) United States Patent
He et al.

(10) Patent No.: US 8,972,812 B2
(45) Date of Patent: Mar. 3, 2015

(54) ULTRA LOW-POWER PIPELINED PROCESSOR

(71) Applicant: University of Electronic Science and Technology of China, Chengdu (CN)

(72) Inventors: Yajuan He, Chengdu (CN); Tingting Xia, Chengdu (CN); Tao Luo, Chengdu (CN); Wubing Gan, Chengdu (CN); Bo Zhang, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 118 days.

(21) Appl. No.: 13/929,758

(22) Filed: Jun. 27, 2013

(65) Prior Publication Data
US 2014/0304572 A1 Oct. 9, 2014

(30) Foreign Application Priority Data

Apr. 9, 2013 (CN) .......................... 2013 1 0120537

(51) Int. Cl.
| | | |
|---|---|---|
| G06F 11/00 | (2006.01) |
| G06F 11/30 | (2006.01) |
| G08C 25/00 | (2006.01) |
| H03M 13/00 | (2006.01) |
| H04L 1/00 | (2006.01) |
| G01R 31/317 | (2006.01) |

(52) U.S. Cl.
CPC .................................. G01R 31/317 (2013.01)
USPC .................. 714/746; 326/14; 326/19; 326/90

(58) Field of Classification Search
USPC ................................ 714/746; 326/14, 19, 90
See application file for complete search history.

(56) References Cited

U.S. PATENT DOCUMENTS 8,094,471 B1 * 1/2012 Smith et al. ...................... 363/61

* cited by examiner

*Primary Examiner* — Sam Rizk
(74) *Attorney, Agent, or Firm* — Matthias Scholl P.C.; Matthias Scholl

(57) ABSTRACT

A pipelined processor including a combinational logic of several stages, a voltage regulator, a counter, a comparator, and a plurality of stage registers. Each stage register is disposed between two adjacent stages of the combinational logic. The stage register includes a flip-flop, a latch, an XOR gate, and a MUX module. When the high level of a register clock is coming, the flip-flop latches first data at the rising edge, and the latch receives second data during the high level. The data latched by the flip-flop and the latch respectively are compared by the XOR gate. If they are same, the output Error of the XOR gate is low level, and the output of the flip-flop is delivered to the next stage. Otherwise, the output Error of the XOR gate is high level, and the output of the latch is delivered to the next stage.

5 Claims, 5 Drawing Sheets

ULTRA LOW-POWER PIPELINED PROCESSOR

CROSS-REFERENCE TO RELATED APPLICATIONS

Pursuant to 35 U.S.C. §119 and the Paris Convention Treaty, this application claims the benefit of Chinese Patent Application No. 201310120537.7 filed Apr. 9, 2013, the contents of which, are incorporated herein by reference. Inquiries from the public to applicants or assignees concerning this document or the related applications should be directed to: Matthias Scholl P. C., Attn.: Dr. Matthias Scholl Esq., 14781 Memorial Drive, Suite 1319, Houston, Tex. 77079.

BACKGROUND OF THE INVENTION

1. Field of the Invention

The invention generally relates to the field of computer hardware design, and more particularly to a pipelined processor. Specifically, the invention relates to a pipelined processor which combines the advantage of in-situ error detection and correction, and the use of free slack time of noncritical stages. It can be used in designs of low power processor cores which can minimize the dynamic power by applying the techniques of adaptive voltage scaling (AVS).

2. Description of the Related Art

With the development of the integrated circuit manufacturing technologies, high-performance design and energy-efficient design have become synonymous (power-aware high-performance design becomes more and more important). The total power dissipation of an integrated circuit is divided into two major components: the dynamic component and the leakage component. And the dynamic component, which is proportional to clock frequency, overall capacitance and square of the supply voltage, is overriding compared to the leakage component. In order to save energy as much as possible, it is significant to scale the supply voltage as low as possible. At present, processors have different hardware and software strategies to achieve power management and different mode control to reduce its power consumption. The power management technology related to supply voltage modulation mainly includes the dynamic voltage and frequency scaling (DVFS) technology and the adaptive voltage scaling (AVS) technology.

The DVFS technology regulates a processor's operating clock frequency and supply voltage (for one specific system, the higher the clock frequency, the higher the supply voltage is) according to different application needs, so as to achieve the goal of energy saving. The common workflow of DVFS technology: first, the acquisition of the system load signals; then, the calculation of the current system load; last, the prediction of the performance needed in the next period according to the current system load. There are a variety of prediction algorithms based on the specific application and implemented with software and hardware support. The performance prediction is transformed into the form of clock frequency to regulate the processor matching the new clock frequency. So, compared to the DFVS technology realized by hardware, the one realized by software is simpler. Note that the clock frequency and the supply voltage regulation must ensure that the processor works robust.

AVS technology regulates the processor's supply voltage according to the adaptive advanced power control (APC) which can track the change of the processor's performance. APC passes the performance of the processor frequency, the temperature changes to the external power management chip by bus interfaces. Then, the external power management chip automatically adjusts supply voltage of the processor according to its performance requirements. This mechanism must ensure the applications run correctly with the maximum clock frequency and the minimum supply voltage.

Many ways are established to realize the AVS technology, for instance, delay chains can be used to simulate the critical path of a system. A periodical signal is input into the delay chain, the output of the delay chain is detected dynamically to adjust the power supply voltage and clock frequency. If the output of the delay chain is wrong, the timing is violated. This indicates that the system does not work correctly and the supply voltage should be increased, because the lower supply voltage leads to the longer delay time of all devices, which causes the setup timing violation thereby leading to wrong results of the data processing system. A safety margin of supply voltage is preset to ensure that the system can run correctly in the worst case for the system cannot judge and restore these mistakes by itself. Currently, a great deal of power management technology have this kind of supply voltage safety margin to limit the supply voltage, which results in conservative power saving. How to further reduce the dynamic power has become a bottleneck in power management technology.

Pipeline belonging to a CPU (Central Processing Unit) is an implementation technique in which multiple instructions are overlapped in execution. Today, the pipeline is a key to make processors fast. Generally, the pipeline consists of several stages which include combinational logic and stage registers to handle an instruction by several steps. For example, as shown in FIG. 1, the classical pipelined processor consists of five stages. The first one is instruction fetch (IF), at this stage, the processor fetches the instruction code from an instruction register. The second one is instruction decode (ID), at this stage, instruction delivered from IF stage was decoded. The third stage is execution (EX), at this stage, the processor executes the instruction decoded by ID stage, and the control signal from ID stage can allow ALU to do all kinds of action such as addition, subtraction and so on. The fourth stage is memory (MEM), at this stage; the processor can store data to memory or load data from memory. The last stage is write-back (WB), at this stage, the processor stores the result to a data register. This pipeline can execute different stages of five instructions in one clock cycle; each instruction will be executed step by step. So the average instruction execution time is shorten, the speed of CPU is accelerated. With the deeper pipeline, the processor executes programs faster and the higher clock frequency can be adopted.

SUMMARY OF THE INVENTION

In view of the above-described problems, it is one objective of the invention to provide a pipelined processor by changing stage registers. The changed stage registers can realize in-situ error detection and correction by adding digital logic, so the pipeline achieves progressive energy saving by cutting off the safe margin and exploiting free slack time of the noncritical stages. Moreover, the number of errors can be used to adjust the supply voltage effectively.

To achieve the above objective, in accordance with one embodiment of the invention, there is provided a pipelined processor, as shown in FIG. 2. The pipelined processor comprises a combinational logic of several stages (for example, the classical five-stage pipelined processor: IF; ID; EX; MEM; WB), a voltage regulator, a counter, a comparator, and a plurality of stage registers. The stage registers are double latch (DL) registers and each is disposed between two adjacent stages of the combinational logic. The DL register, as shown in FIG. 3, comprises a flip-flop, a latch, an XOR gate and a MUX module. When a high level of a register clock CLK1 is coming, the flip-flop latches first data at the rising edge, and the latch receives second data during the high level of the CLK1. The data latched by the flip-flop and the latch respectively (the outputs of the flip-flop and the latch) are then compared by the XOR gate. If they are same, the output Error of the XOR gate is low level, the output A of the flip-flop is delivered to the next stage. Otherwise, the output Error of the XOR gate is high level, the output B of the latch is delivered to the next stage.

The output Error of the last DL register which is disposed between the MEM stage and the WB stage in the five stages pipeline is inverted, then AND with the clock CLK to obtain the CLK1. Meanwhile, the rising edge of the output Error is used to count the counter. The result $E_{\_sample}$ of the counter in a count cycle is compared with the reference error number $E_{\_ref}$ by the comparator. If $E_{\_sample} > E_{\_ref}$, the result $E_{\_diff}$ of the comparator controls the voltage regulator to augment the supply voltage of processor. If $E_{\_sample} < E_{\_ref}$, the result $E_{\_diff}$ of the comparator controls the voltage regulator to reduce the supply voltage of processor. If $E_{\_sample} = E_{\_ref}$, the result $E_{\_diff}$ of the comparator controls the voltage regulator to maintain the supply voltage of processor.

The pipelined processor which is improved based on the classical pipelined processor of five stages can minimize the dynamic power by applying the AVS technology. The stage registers of the classical pipeline, as shown in FIG. 1, is replaced by the DL registers of this invention. The DL register, as shown in FIG. 3, comprises a flip-flop, a latch, an XOR gate and a MUX module. When the high level of the register clock CLK1 is coming, the flip-flop latches the data D at the rising edge and the latch receives the data D during the high level of the register clock CLK1. The data D latched by them respectively are then compared by the XOR gate. If they are same, the output Error of the XOR gate is low level, this is indicated that the upper stage has no setup timing violation and there is no error, the output A of the flip-flop is delivered to the next stage. If they are different, the output Error of the XOR gate is high level, this is indicated that the upper stage has the setup timing violation and there is an error, the output B of the latch is delivered to the next stage.

The pipelined processor of this invention can realize in-situ error detection and correction because the DL registers use the flip-flop and the latch to latch the data in parallel. When the critical delay time of the upper stage exceeds the clock cycle but less than the high level time of the cycle plus the clock cycle, the latch still can pass the right data to the next stage. As thus, if the processing time of the next stage's combinational logic is short enough for the data processing, processing can be accomplished before the rising edge of the CLK1, then the DL registers of the next stage can pass the correct data by the flip-flop. Even if the processing time of the next stage's combinational logic is long and the data processing can't be accomplished before the rising edge of the CLK1, the free slack time of subsequent stages can be used to processes the data similarly. Provided that the output Error of the last DL register disposed between the MEM stage and the WB stage in the five stages pipeline is low level, the result of this instruction is right even though the output Error of the front DL stages is high level. In conclusion, the DL registers can borrow the free slack time from subsequent stages, the error is allowed in the process of processing instruction, so the pipeline achieves progressive energy saving by cutting off the safe margin and exploiting noncritical stages.

If the pipelined processor works under high supply voltage in a count cycle of the counter, the combinational logic of every stage has no timing violation, the data received by the latch and the data latched by the flip-flop is the same and the clock CLK1 of every DL register is same with the clock CLK of the system. Every DL register selects the output A of the flip-flop as the output Q, the output Error of every XOR is low level, so the result $E_{\_sample}$ of the counter is smaller than $E_{\_ref}$, the output $E_{\_diff}$ of the comparator controls the voltage regulator to reduce the supply voltage of the processor. When the power supply voltage is reduced to a certain point, the combinational logic of some stages have timing violation, some DL registers select the output A of the flip-flop as the output Q and some DL registers select the output B of the latch as the output Q. If the output Error of the last DL register disposed between the MEM stage and the WB stage in the five stages pipeline is still low level, the clock CLK1 of every DL register is same with the clock CLK of the system, and the result $E_{\_sample}$ of the counter is smaller than $E_{\_ref}$, the output $E_{\_diff}$ of the comparator controls the voltage regulator to reduce the supply voltage of the processor. If the power supply voltage is reduced further, the number of timing violation of the combinational logic increases, and the output Error of the last DL register is high level, the clock CLK1 of every DL register is low level until this instruction is processed completely, the counter plus one at the same time. Note that the hold time of the low level is an integral multiple of the clock CLK cycle. In a count cycle, the counter is used to record the times of the output of XOR changes into high level, namely, the number of instructions which can't be processed correctly. If the result $E_{\_sample}$ of the counter is larger than $E_{\_ref}$, the output $E_{\_diff}$ of the comparator controls the voltage regulator to increase the supply voltage of the processor. If the result $E_{\_sample}$ of the counter is same as $E_{\_ref}$, the output $E_{\_diff}$ of the comparator controls the voltage regulator to maintain the supply voltage of the processor. The count cycle of the counter is an integral multiple of the clock CLK cycle, such as 50-200 times.

In conclusion, the invention changes the stage registers of the pipeline. The changed stage registers can realize in-situ error detection and correction by adding digital logic, so the pipeline achieves progressive energy saving by cutting off the safety margin and exploiting free slack time of the noncritical stages.

DETAILED DESCRIPTION OF THE EMBODIMENTS

Figure 1:
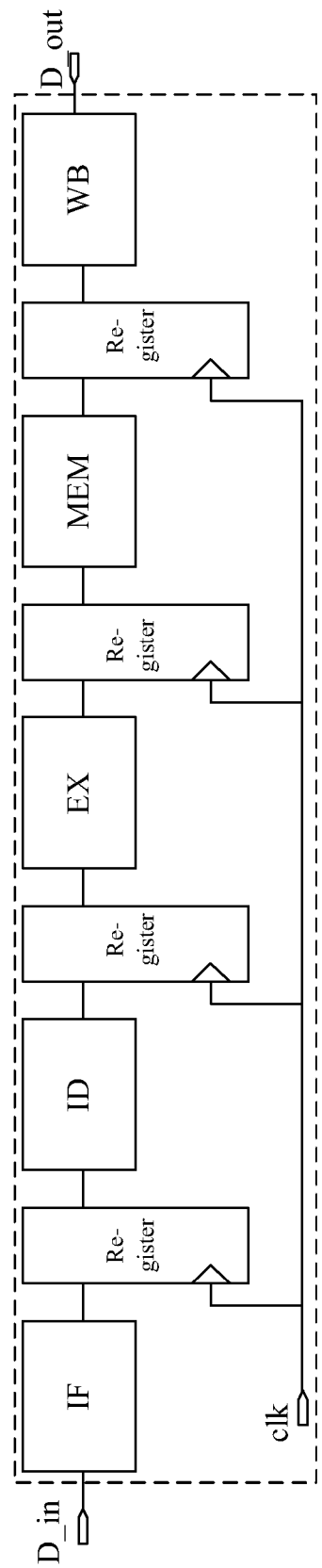
FIG. 1 is a block diagram of a conventional five-stage pipelined processor.
Figure 2:
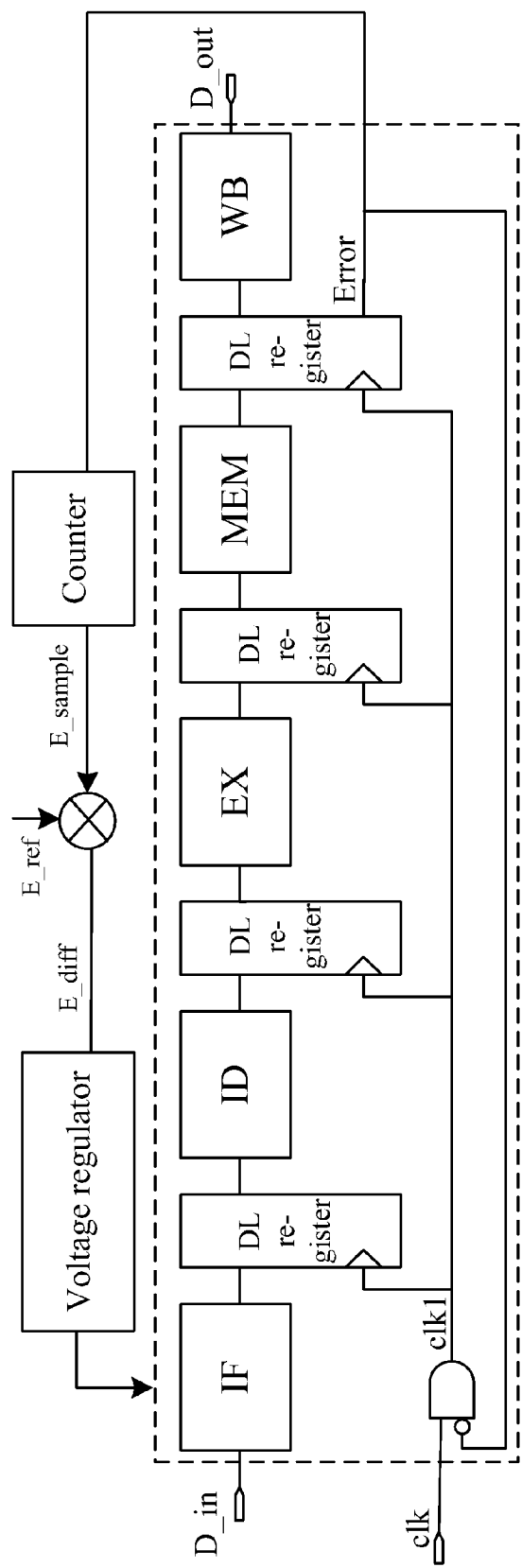
FIG. 2 shows a block diagram of a pipelined processor according to one embodiment of the invention.
Figure 3:
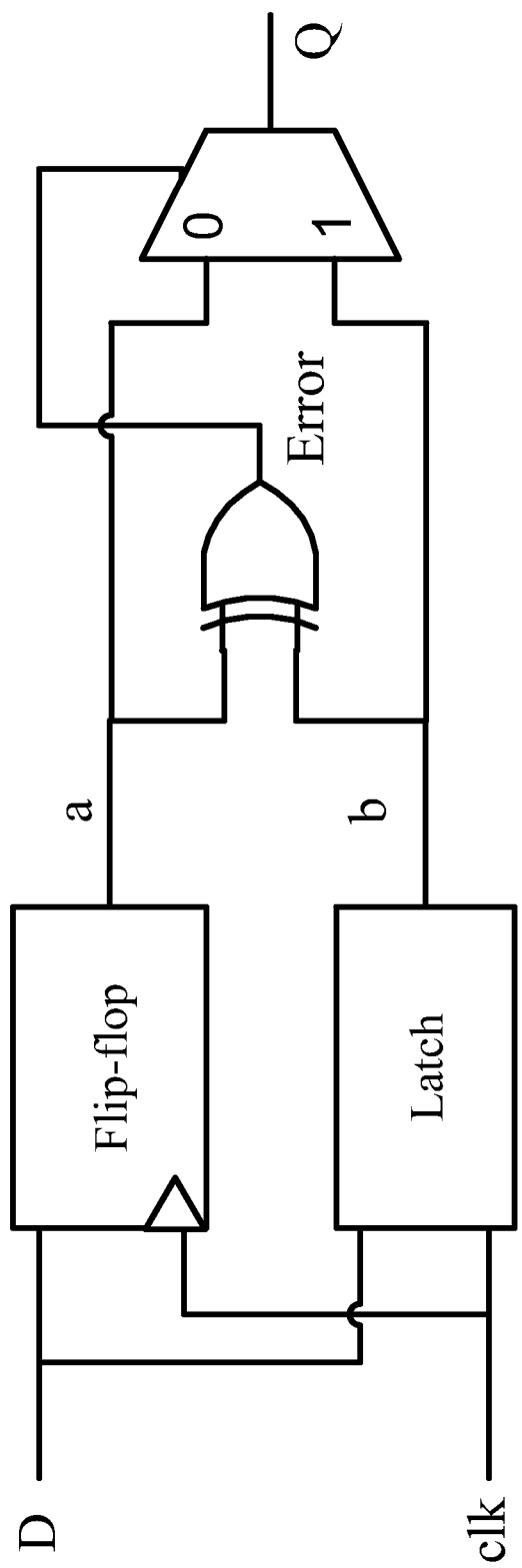
FIG. 3 is a circuit diagram of a DL register shown in FIG. 2.

FIG. 2 shows a block diagram of a pipelined processor, which comprises a combinational logic of several stages (for examples, the classical pipelined processor of five stages: IF; ID; EX; MEM; WB), a voltage regulator, a counter, a comparator and stage registers which can be named DL registers. The DL register, as shown in FIG. 3, comprises a flip-flop, a latch, an XOR gate, and a MUX module. When the high level of register clock CLK1 is coming, the flip-flop latches the data D at the rising edge and the latch receives the data D during the high level of the register clock CLK1. The data D latched by them respectively are then compared by the XOR gate. If they are same, the output Error of the XOR gate is low level, the output A of the flip-flop is delivered to the next stage. If they are different, the output Error of the XOR gate is high level, the output B of the latch is delivered to the next stage.

The output Error of the last DL register which is disposed between the MEM stage and the WB stage in the five stages pipeline is inverted, then AND with the clock CLK obtained the register clock CLK1. Meanwhile, the rising edge of the output Error is used to count the counter. The result $E_{\_sample}$ of the counter in a count cycle is compared with the reference error number $E_{\_ref}$ by the comparator. If $E_{\_sample} > E_{\_ref}$, the result $E_{\_diff}$ of the comparator controls the voltage regulator to augment the supply voltage of processor. If $E_{\_sample} < E_{\_ref}$, the result $E_{\_diff}$ of the comparator controls the voltage regulator to reduce the supply voltage of processor. If $E_{\_sample} = E_{\_ref}$, the results $E_{\_diff}$ of the comparator controls the voltage regulator to maintain the supply voltage of processor.

Figure 4:
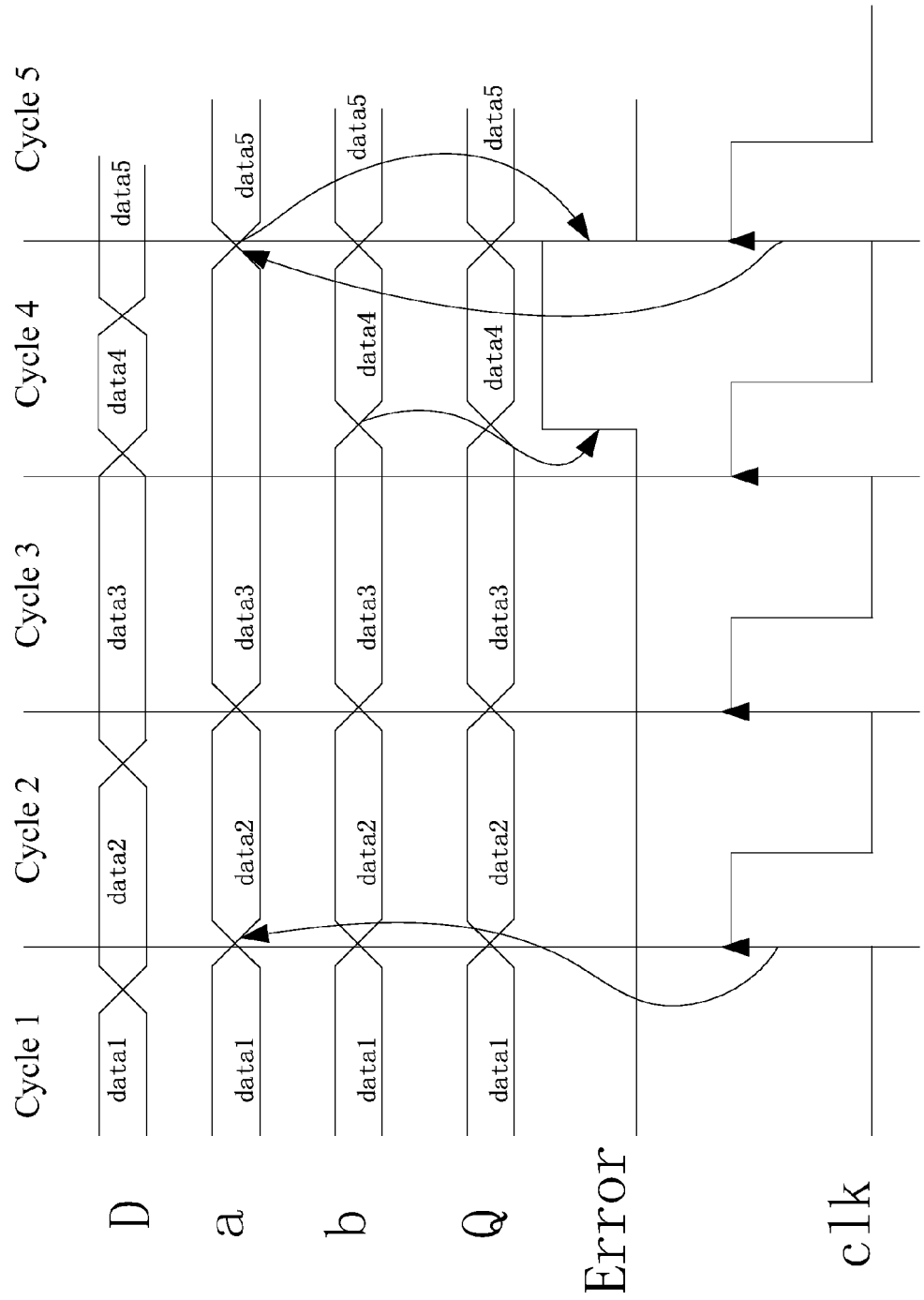
FIG. 4 is a timing diagram schematically illustrating an operation of a DL register.

FIG. 4 is a timing diagram schematically illustrating the operation of a DL register. In clock cycle 1 and cycle 2, the combination logic meets the setup time at the rising edge of the clock, and both the main flip-flop and the latch can latch the correct data. In this condition, the signal Error maintains low and the operation of the pipeline is normal. The condition of timing error appears in cycle 3. The combinational logic exceeds the intended delay due to sub-critical voltage scaling. In this case, the main flip-flop fails to latch the data at the rising edge of the clock, but since the latch is high level enabled, the data are latched by latch correctly in cycle 4. As the data latched in the main flip-flop and the latch are different, the Error signal is set valid at the output of the comparator. Then, the MUX controlled by Error signal chooses the output of the latch as the output of the whole register. So the output of the register is correct. In clock cycle 4, the combination logic meets the setup time at the rising edge of the clock, the signal Error turns to low and the operation of the pipeline is back to normal.

Figure 5:
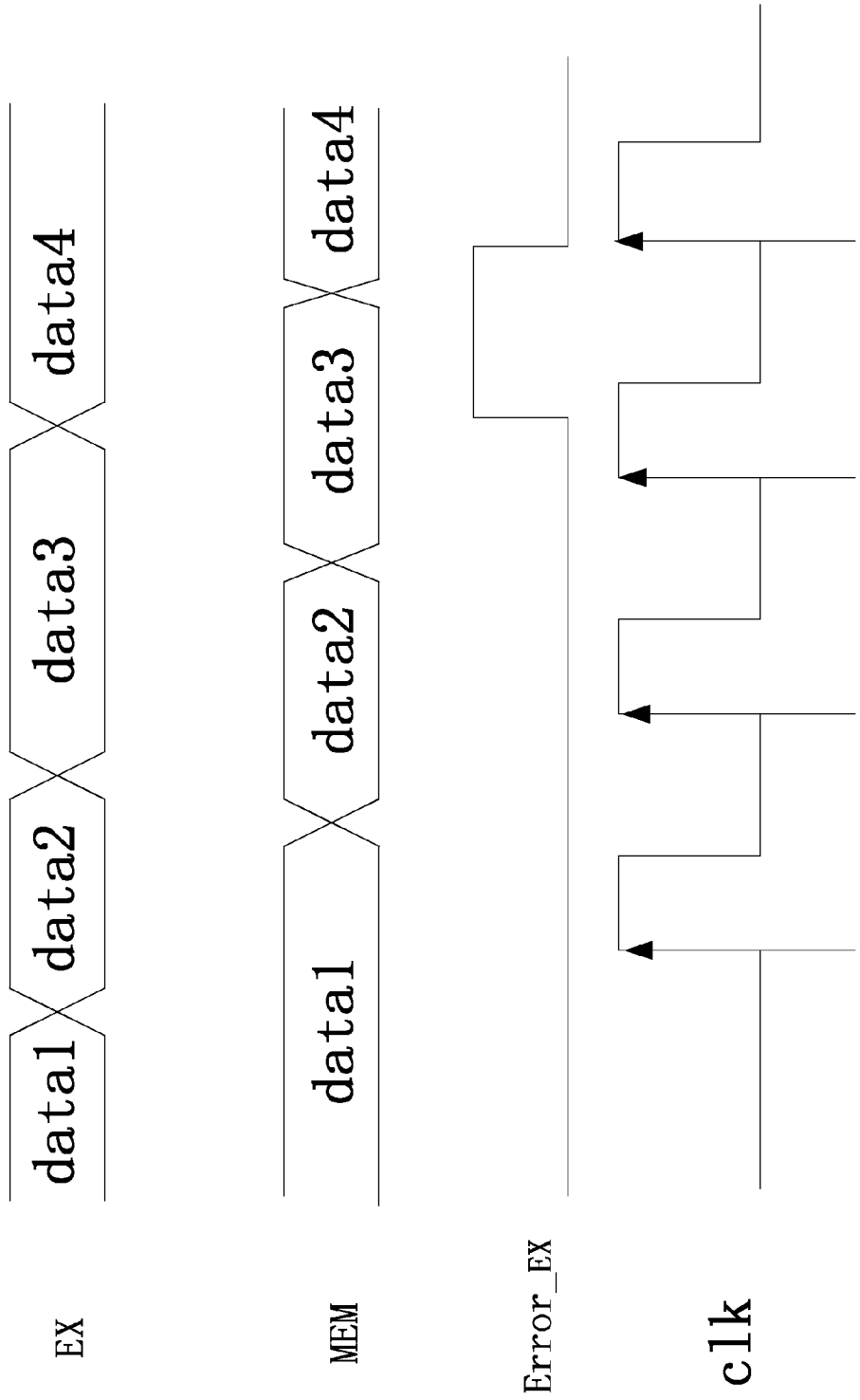
FIG. 5 is a timing diagram schematically illustrating a critical EX stage borrows time from noncritical MEM stage.

FIG. 5 is a timing diagram schematically illustrating the critical EX stage borrows time from noncritical MEM stage. The pressure on the critical stage is released by exploiting the next noncritical stage. At first and second rising edge of clock, the EX stage and MEM stage both satisfy the timing requirement and the Error signal remains low. The operation of the pipeline is normal. At the third rising edge of clock, the critical stage fails to satisfy the timing constraint namely that data 4 does not arrive at the rising edge of clock, and then $Error_{\_Ex}$ signal is set valid to indicate this timing error. However, since error detection and correction mechanism is applied, the correct data 4 still delivers to the MEM stage by the latch after the third rising edge of the clock, then data 4 is processed by the MEM stage. At the forth rising edge of the clock, the memory is completed, the Error signal of the MEM stage remains low all the time, otherwise the $Error_{\_Ex}$ signal of the EX stage turns to low.

The use of high level enabling latch raises the possibility that a short path in the combinational logic will corrupt the data in the latch. A short-path allows data launched at the start of a cycle to be latched into the latch, instead of the data launched from the previous cycle. As we design, the latch should lock the data from previous cycle as the main flip flop does, however, if the delay of the stage is too short, the data will arrive the latch before the lock window closes. Therefore, a minimum-path length constraint should be applied to the input of each register to avoid this corruption. These minimum-path constraints result in the addition of buffers to slow down the fast path and therefore introduce a certain overhead. However, the fast path of the pipeline stage is rare so the number of buffer is negligible, which makes the overhead negligible. Note that the duty cycle of the clock CLK determines how serious the minimum-path length constraint can be. A large duty ratio of clock increases the severity of the short path constraint and therefore increases the power overhead due to the need for additional buffers. On the other hand, a small duty ratio of clock reduces the margin between the main flip-flop and the latch, and hence reduces the amount by which the supply voltage can be dropped below the critical supply voltage. Thus the duty ratio represents a trade-off between the cost due to buffer added and the power saved from the lowing of supply voltage. The above two approaches are used synchronously to reduce the possibility of a short path.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A pipelined processor, comprising:
   a) a combinational logic of several stages;
   b) a voltage regulator;
   c) a counter;
   d) a comparator; and
   e) a plurality of stage registers, said stage registers being double latch (DL) registers and each being disposed between two adjacent stages of said combinational logic;
   wherein
   said DL register comprises a flip-flop, a latch, an XOR gate, and a MUX module;
   when a high level of a register clock CLK1 is coming, said flip-flop latches first data at the rising edge, and said latch receives second data during the high level of said register clock CLK1;
   said data, latched by said flip-flop and said latch respectively, are compared by said XOR gate: if they are same, an output Error of said XOR gate is low level, and an output A of said flip-flop is delivered to a next stage; if they are different, the output Error of said XOR gate is high level, and an output B of said latch is delivered to the next stage;
   the output Error of a last DL register is inverted, then AND with a clock CLK of said processor to obtain said register clock CLK1, and meanwhile, the rising edge of the output Error is used to count said counter; and
   the result $E_{\_sample}$ of said counter in a count cycle is compared with a reference error number $E_{\_ref}$ by said comparator: if $E_{\_sample} > E_{\_ref}$, the result $E_{\_diff}$ of said comparator controls said voltage regulator to augment the supply voltage of said processor; if $E_{\_sample} < E_{\_ref}$, the result $E_{\_diff}$ of said comparator controls said voltage regulator to reduce the supply voltage of said processor; and if $E_{\_sample} = E_{\_ref}$, the result $E_{\_diff}$ of said comparator controls said voltage regulator to maintain the supply voltage of said processor.

2. The pipelined processor of claim 1, wherein said count cycle of said counter is an integral multiple of said clock CLK cycle.

3. The pipelined processor of claim 2, wherein said count cycle of said counter is 50-200 times said clock CLK cycle.

4. The pipelined processor of claim 1, wherein a buffer is added to slow down fast path, so that the delay time of said fast path is longer than the hold time of the clock's high level.

5. The pipelined processor of claim 1, wherein a buffer is added to slow down fast path, so that the delay time of said fast path is longer than the hold time of the clock's high level, and meanwhile, said hold time of the clock's high level is shortened, whereby appropriately reducing the duty ratio of the clock.

* * * * *